(12) United States Patent
Kim et al.

(10) Patent No.: US 8,878,208 B2
(45) Date of Patent: Nov. 4, 2014

(54) ILLUMINATING DEVICE

(71) Applicants: Ki Hyun Kim, Seoul (KR); Eun Hwa Kim, Seoul (KR)

(72) Inventors: Ki Hyun Kim, Seoul (KR); Eun Hwa Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/765,987

(22) Filed: Feb. 13, 2013

(65) Prior Publication Data

US 2013/0214304 A1 Aug. 22, 2013

(30) Foreign Application Priority Data

Feb. 16, 2012 (KR) .................. 10-2012-0015922

(51) Int. Cl.
*H01L 33/58* (2010.01)
*H01L 25/07* (2006.01)
*H01L 25/075* (2006.01)

(52) U.S. Cl.
CPC ............ *H01L 33/58* (2013.01); *H01L 25/0753* (2013.01)
USPC .................. 257/89; 257/13; 257/79; 257/103; 257/E33.054; 257/E51.018

(58) Field of Classification Search
USPC ..................................... 257/13, 79–103, 918, 257/E51.018–E51.022, E33.001–E33.077, 257/E33.054, E25.028, E25.032
See application file for complete search history.

(56) References Cited

U.S. PATENT DOCUMENTS

| | | | |
|---|---|---|---|
| 7,518,150 B2 | 4/2009 | Aihara | 257/79 |
| 2007/0030675 A1* | 2/2007 | Oon et al. | 362/237 |
| 2009/0135581 A1* | 5/2009 | Yano et al. | 362/84 |
| 2012/0205686 A1* | 8/2012 | Seo et al. | 257/89 |

FOREIGN PATENT DOCUMENTS

| | | |
|---|---|---|
| JP | 2005-005482 A | 1/2005 |
| JP | 2010-034183 A | 2/2010 |
| JP | 2010-034184 A | 2/2010 |
| JP | 2010-258479 A | 11/2010 |
| KR | 10-0891810 B1 | 4/2009 |
| KR | 10-1018153 B1 | 2/2011 |
| KR | 10-2011-0107631 A | 10/2011 |
| KR | 10-2011-0112620 A | 10/2011 |

OTHER PUBLICATIONS

International Search Report dated Apr. 25, 2013 issued in Application No. PCT/KR2013/000284.

* cited by examiner

*Primary Examiner* — Mamadou Diallo
(74) *Attorney, Agent, or Firm* — KED & Associates LLP

(57) ABSTRACT

An illuminating device that may include a substrate; a first light emitting chip which is disposed on the substrate; a second light emitting chip which is spaced apart from the first light emitting chip and is disposed on the substrate; a first lens which includes a first cylindrical side having a height greater than the thickness of the first light emitting chip and includes a first spherical or hemispherical curved surface formed on the first side, and which surrounds the first light emitting chip; and a second lens which includes a second cylindrical side having a height greater than the thickness of the second light emitting chip and includes a second spherical or hemispherical curved surface formed on the second side, and which surrounds the second light emitting chip, wherein at least a portion of the first side contacts with at least a portion of the second side.

20 Claims, 3 Drawing Sheets

— Spectral Distribution and CRI

ILLUMINATING DEVICE

CROSS-REFERENCE TO RELATED APPLICATION

The present application claims priority under 35 U.S.C. §119(e) of Korean Patent Application No. 10-2012-0015922 filed on Feb. 16, 2012, which is hereby incorporated by reference in its entirety.

BACKGROUND

1. Field

An embodiment of the present invention relates to an illuminating device capable of creating a high color rendering index (CRI).

2. Description of Related Art

Recently, as information communication equipments becomes smaller and thinner, various parts of the equipment, for example, a resistance, a condenser, a noise filter, and the like, become much smaller and are manufactured in the type of a surface mount device in order to be directly mounted on a printed circuit board (PCB). Accordingly, an LED lamp is now also being developed in the type of a surface mount device.

The surface mount device typed LED lamp is capable of creating light having various colors and has advantages like a high color rendering property, stability, energy conservation, etc. Therefore, the surface mount device typed LED lamp is now widely used as a back light unit (BLU) of a liquid crystal display (LCD), a light source of lighting and the like as well as a light source of a portable electronic device.

Here, regarding a conventional LED package used as a light source of lighting, a light emitting device chip is mounted within a mixing chamber, and a remote phosphor is disposed on the light emitting device chip.

However, in the conventional LED package, since the light emitting device chips are critically configured with respect to an optical efficiency and a color coordinate, the color coordinate of each product is changed and deviation occurs. This causes poor quality of the product and considerably decreases the reliability of the product.

SUMMARY

One embodiment is an illuminating device including: a substrate; a first light emitting chip which is disposed on the substrate; a second light emitting chip which is spaced apart from the first light emitting chip and is disposed on the substrate; a first lens which includes a first cylindrical side having a height greater than the thickness of the first light emitting chip and includes a first spherical or hemispherical curved surface formed on the first side, and which surrounds the first light emitting chip; and a second lens which includes a second cylindrical side having a height greater than the thickness of the second light emitting chip and includes a second spherical or hemispherical curved surface formed on the second side, and which surrounds the second light emitting chip. At least a portion of the first side contacts with at least a portion of the second side.

Another embodiment is an illuminating device including: a substrate; a first light emitting chip which is disposed on the substrate; a second light emitting chip which is spaced apart from the first light emitting chip and is disposed on the substrate; a first lens which includes a first cylindrical side having a height greater than the thickness of the first light emitting chip and includes a first spherical or hemispherical curved surface formed on the first side, and which surrounds the first light emitting chip; and a second lens which includes a second cylindrical side having a height greater than the thickness of the second light emitting chip and includes a second spherical or hemispherical curved surface formed on the second side, and which surrounds the second light emitting chip. When it is assumed that a change rate of a sag (a degree of slope) of the second lens is represented by "f", a change rate of the sag of the first lens is represented by "c", change rates of the sags of the first and the second lenses are represented by "g", a slope between the centers of the first and the second lenses is represented by "LS", a slope between the centers of the first and the second light emitting chips is represented by "CS" and a slope rate is represented by "h", it is defined that g=f/c, h=LS/CS and g/h=a result "i". The first and the second light emitting chips and the first and the second lenses are designed such that the result "i" is determined to satisfy a predetermined color difference based on the intensity of light.

BRIEF DESCRIPTION OF THE DRAWINGS

Arrangements and embodiments may be described in detail with reference to the following drawings in which like reference numerals refer to like elements and wherein.

DETAILED DESCRIPTION

A thickness or a size of each layer may be magnified, omitted or schematically shown for the purpose of convenience and clearness of description. The size of each component may not necessarily mean its actual size.

It should be understood that when an element is referred to as being 'on' or "under" another element, it may be directly on/under the element, and/or one or more intervening elements may also be present. When an element is referred to as being 'on' or 'under', 'under the element' as well as 'on the element' may be included based on the element.

An embodiment may be described in detail with reference to the accompanying drawings.

Embodiment

Figure 1:
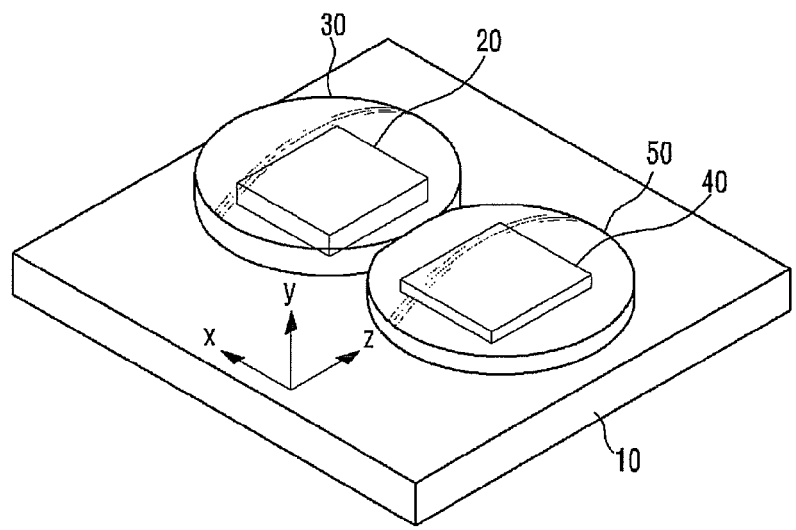
FIG. 1 is a perspective view of an illuminating device according to an embodiment.
Figure 2:
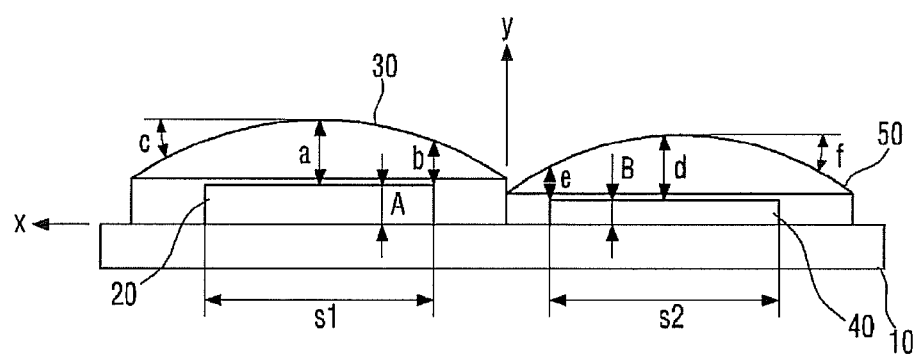
FIG. 2 is a cross sectional view of the illuminating device according to the embodiment.

FIGS. 1 and 2 are a perspective view and a cross sectional view of an illuminating device according to an embodiment.

As shown in FIGS. 1 and 2, the illuminating device includes a substrate 10, a first and a second light emitting chips 20 and 40 which are disposed on the substrate 10, and a first and a second lenses 30 and 50 which are formed to surround the first and the second light emitting chips 20 and 40 respectively.

The substrate 10 has a quadrangular plate shape. However, there is no limit to this. The substrate 10 may have various shapes like a circular shape, a polygonal shape and the like.

The substrate 10 may be formed by printing circuit patterns on an insulator. For example, the substrate 10 may include a printed circuit board (PCB), a metal core PCB (MCPCB), a flexible PCB (FPCB), a ceramic substrate and the like. Also, the substrate 10 may include a chips-on-board (COB) allowing an LED chip to be directly bonded to a printed circuit board. The substrate 10 may be formed of a material capable of efficiently reflecting light. The surface of the substrate 10 may have a color such as white, silver and the like capable of efficiently reflecting light. The surface of the substrate 10 may be coated with a color capable of efficiently reflecting light, for example, white, silver and the like.

The substrate 10 may have a size of 1.3×1.3×0.3 and the surface of the substrate 10 may have an optical reflectance greater than 78%.

The first and the second light emitting chips 20 and 40 are disposed separately from each other by a predetermined interval. The first and the second lenses 30 and 50 are formed to surround the first and the second light emitting chips 20 and 40.

The first and the second light emitting chips 20 and 40 may be a light emitting diode (LED) chip which emits red, green and blue lights or may be a light emitting diode which emits UV. Here, the light emitting diode (LED) chip may have a lateral type or a vertical type and may emit blue, red, yellow or green light.

Also, the first and the second light emitting chips 20 and 40 may have a fluorescent material. The fluorescent material may include at least any one selected from a group consisting of a garnet material (YAG, TAG), a silicate material, a nitride material and an oxynitride material. Otherwise, the fluorescent material may include at least any one selected from a group consisting of a yellow fluorescent material, a green fluorescent material and a red fluorescent material.

In the embodiment, the first and the second light emitting chips 20 and 40 are comprised of a blue chip and a red chip. Also, one of the first and the second light emitting chips 20 and 40 may be comprised of the blue chip and a single or multiple yellow fluorescent materials and the green fluorescent materials.

In more detail, the first light emitting chip 20 may be comprised of the blue chip. The second light emitting chip 40 may be comprised of the red chip. Here, it is possible to cause the first lens 30 surrounding the blue chip to emit white light by using the yellow fluorescent material.

At least one light emitting device (not shown) is disposed in the first and the second light emitting chips 20 and 40. A light emitting wavelength of the light emitting device exists in a visible light region or in a near-infrared light region and may be manufactured with material satisfying conditions, e.g., high light emission efficiency, p-n junction manufacturability and the like. Such a material may include compound semiconductor materials, for instance, GaN, GaAs, GaP, GaAs1-xPx Ga1-xAlxAs, InP, In1-xGaxP and the like. In particular, among the materials, group III nitride blue LED like GaN, etc., may be used to form the light emitting device. In this case, the first and the second lenses 30 and 50 may include the single or multiple yellow fluorescent materials and the green fluorescent materials. Here, the yellow fluorescent material may include the silicate material or YAG and may have a wavelength of 540 mm to 585 mm. The green fluorescent material may include the silicate material or nitride material and may have a wavelength of 510 mm to 535 mm.

Through such a configuration, as blue light or red light emitted from the first and the second light emitting chips 20 and 40 passes through the first lens 30 or the second lens 50, the blue light or the red light is absorbed and excited by the yellow fluorescent material and the green fluorescent material. Light in the entire range of visible light is generated due to second light generated by such energy conversion. Thus, white light is created by color mixing caused by the scatter of the light.

While it has been described above in the embodiment that the white light is created by using the first and the second light emitting chips 20 and 40 and the first and the second lenses 30 and 50, the white light can be created through another combination of the first and the second light emitting chips 20 and 40 and the first and the second lenses 30 and 50.

Specifically, the fluorescent material emits light by absorbing light emitted from the light emitting devices of the first and the second light emitting chips 20 and 40 or by absorbing light emitted from another fluorescent material. Here, the light emitting device is able to emit blue, green or red light in accordance with the kind of impurities. Therefore, the white light can be created through a combination of the light emitting device and the fluorescent material. For example, the white light can be created through a combination of the blue LED and the yellow fluorescent material or through a combination of the blue LED and the red/green fluorescent materials. For another example, the white light can be created through a combination of the UV chip and the red/green/blue fluorescent materials. Accordingly, the first and the second lenses 30 and 50 are formed depending on the light emitting device, thereby forming an illuminating device capable of emitting the white light.

For more detailed example, the white light can be created by mixing red, green and blue three primary colors or by mixing two complementary colors. The white light can be created by the three primary colors through the use of a first fluorescent material which emits red light by absorbing first light emitted from the light emitting device, a second fluorescent material which emits the green light, and a third fluorescent material which emits the blue light. Accordingly, the first and the second lenses 30 and 50 are formed by using the first to the third fluorescent materials, thereby forming the illuminating device capable of emitting the white light.

Also, the white light can be created by mixing the first light and the second light through the use of the LED which emits the blue light, the first fluorescent material which absorbs the blue light and emits the red light, and the second fluorescent material which emits the green light. In this case too, the first and the second lenses 30 and 50 are formed by using the first and the second fluorescent materials, thereby forming the illuminating device capable of emitting the white light.

In addition to the above-mentioned example, the white light can be also created by the complementary colors, for example, through the use of the first fluorescent material which absorbs the first light from the light emitting device and emits the blue light, and the second fluorescent material which emits the yellow light, or through the use of the first fluorescent material which absorbs the light from the light emitting device and emits the green light, and the second fluorescent material which emits the red light. In this case too, the first and the second lenses 30 and 50 are formed by using the first and the second fluorescent materials, thereby forming the illuminating device capable of emitting the white light.

In the above-described embodiment, the blue fluorescent material may include $ZnS:Ag$, $ZnS:Ag+In_2O_3$, $ZnS:Zn+In_2O_3$, $(Ba, Eu)MgAl_{10}O_{17}$ and the like. The green fluorescent material may include $ZnS:Cu$, $Y_2Al_5O_{12}:Tb$, $Y_2O_2S:Tb$ and the like. The red fluorescent material may include $Y_2O_2S:Eu$, $Y_2O_3:Eu$, $YVO_4:Eu$ and the like. $YAG:Ge$, $YAG:Ce$ and the like may be used as the yellow fluorescent material.

Subsequently, the first and the second lenses 30 and 50 are disposed on the substrate 10 on which the first and the second light emitting chips 20 and 40 have been disposed.

As shown in FIGS. 1 and 2, the first and the second lenses 30 and 50 include a cylindrical side formed perpendicular to the substrate 10, and a curved surface which is spherically or hemispherically formed on the cylindrical side. Here, sides of the first and the second lenses 30 and 50 have heights which are greater than the thickness "A" of the first light emitting chip 20 and the thickness "B" of the second light emitting chip 40 respectively. Also, at least a portion of the side of the first lens 30 contacts with at least a portion of the side of the second lens 50. Therefore, when the first lens 30 and the second lens 50 are viewed from the top thereof, they are formed in a peanut shape obtained by connecting the two circular shapes. The height of the first light emitting chip 20 is different from the height of the second light emitting chip 40. Also, the height (a+A) of the curved surface of the first lens 30 is different from the height (d+B) of the curved surface of the second lens 50.

The first and the second lenses 30 and 50 may be comprised of a spherical or aspherical lens having a beam angle greater than 160°. While the first and the second lenses 30 and 50 may be formed to have a spherical or aspherical shape, the first and the second lenses 30 and 50 may be also formed to have a concave or convex shape. Here, the first and the second lenses 30 and 50 may be formed of epoxy resin, silicon resin, urethane resin or a compound of them.

The first and the second lenses 30 and 50 having such a configuration increase an orientation angle of light emitted from the first and the second light emitting chips 20 and 40, so that the uniformity of a linear light source of the illuminating device can be improved.

Further, in the first and the second lenses 30 and 50, a reflective layer (not shown) may be formed on the bottom surface contacting with the substrate 10. Here, the reflective layer may be formed of at least any one selected from the group consisting of metallic material, for example, Al, Cu, Pt, Ag, Ti, Cr, Au and Ni in the form of a single layer or a composite layer by a deposition, sputtering, plating, printing methods and the like.

A color difference based on the intensity of the light is adjusted to be less than 0.006 through a lens design of a 2 in 1 chip package to which blue chip yellow phosphor and the red chip have been applied, so that the illuminating device having such a configuration of the embodiment may be designed as follows such that a color spatial uniformity is obtained and a high color rendering index (CRI) having a beam angle greater than 160° and optical efficiency higher than 78% is obtained.

Referring to FIG. 2, it is assumed that a height of a lens resin on the central portion of the first light emitting chip 20 is "a", a height of a lens resin on the edge of the first light emitting chip 20 is "b", a height of a lens resin on the central portion of the second light emitting chip 40 is "d", and a height of a lens resin on the edge of the second light emitting chip 40 is "e". Then, a change rate "c" of a sag (a degree of slope) of the first lens can be represented by a formula of (a−b)/(s1/2), and a change rate "f" of the sag of the second lens can be represented by a formula of (d−e)/(s2/2). Here, the "s1" and "s2" represent the sizes of the first and the second light emitting chips 20 and 40 respectively.

Further, change rates "g" of the sags of the first and the second lenses 30 and 50 can be represented by a formula of f/c which divides the change rate "f" of the sag of the second lens 50 by the change rate "c" of the sag of the first lens 30.

Further, a slope rate "h" can be represented by a formula of LS/CS which divides a slope "LS" between the centers of the first and the second lenses 30 and 50 by a slope "CS" between the centers of the first and the second light emitting chips 20 and 40. Here, the slope "LS" between the centers of the first and the second lenses 30 and 50 can be calculated by a horizontal distance between the top surfaces of the first and the second lenses 30 and 50, and by a height difference between the first and the second lenses 30 and 50. The slope "CS" between the centers of the first and the second light emitting chips 20 and 40 can be calculated by a horizontal distance between the centers of the first and the second light emitting chips 20 and 40, and by a height difference between the first and the second light emitting chips 20 and 40.

Meanwhile, it has been clear that when the color difference based on the intensity of the light is less than 0.006, the illuminating device according to the embodiment is capable of obtaining a color spatial uniformity, a beam angle greater than 160° and optical efficiency higher than 78% through the simulations to be described below of FIGS. 3 to 6.

Accordingly, in the embodiment, the lens of the 2 in 1 chip package to which the blue chip yellow phosphor and the red chip have been applied is designed such that the color difference is less than 0.006.

That is, when a result "i" of the formula of g/h that divides the change rates "g" of the sags of the first and the second lenses 30 and 50 by the slope rate "h" has a range from −0.2 to 0.1 mm, it is satisfied that the color difference is less than 0.006.

Accordingly, in accordance with the formula of g/h that produces the result "i" in the embodiment, the lens of the 2 in 1 chip package to which the blue chip yellow phosphor and the red chip have been applied is designed such that the color difference is less than 0.006, and thus, it is possible to obtain the color spatial uniformity and to implement a high color rendering index (CRI) having a beam angle greater than 160° and optical efficiency higher than 78%.

Example of Simulation

Figure 3:
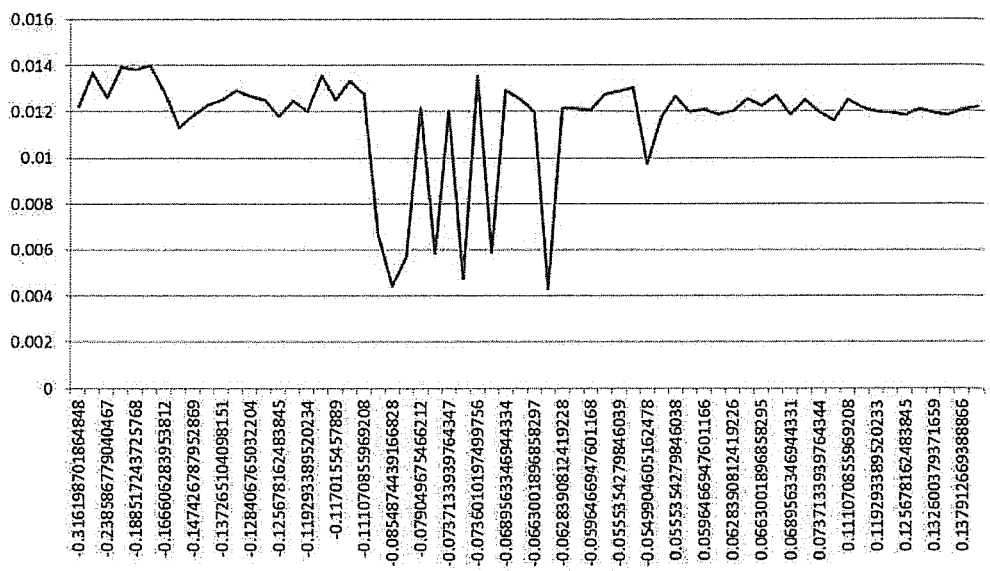
FIG. 3 is a graph showing a result obtained by simulating color difference values of the illuminating device according to the embodiment.
Figure 4:
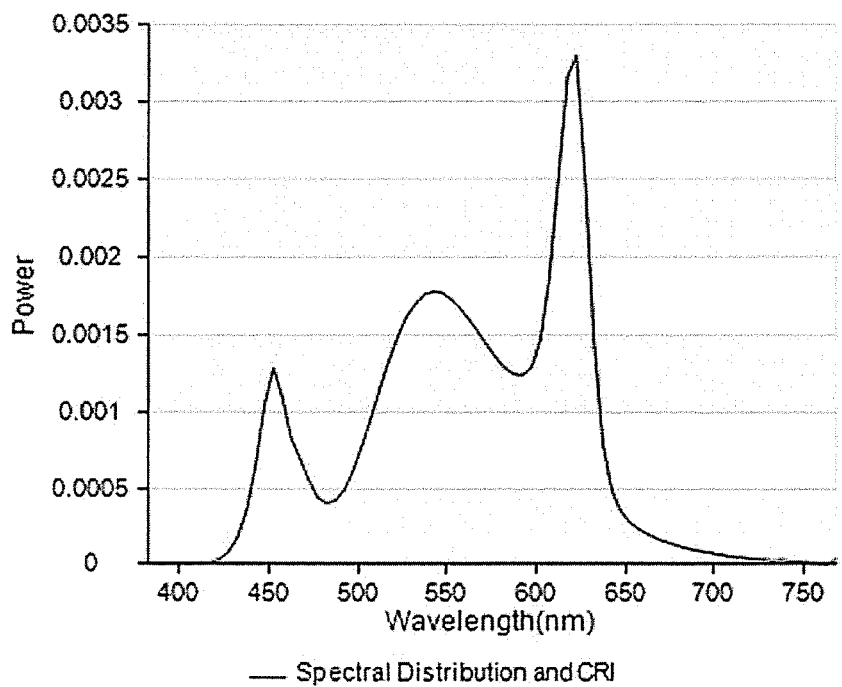
FIG. 4 is a graph showing a spectral distribution and CRI of the illuminating device according to the embodiment.
Figure 5:
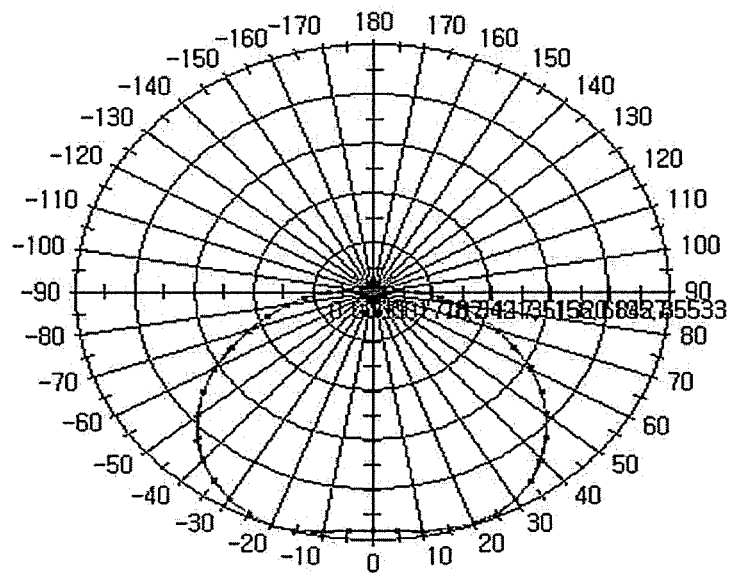
FIG. 5 is a simulation graph showing a luminous intensity distribution of the illuminating device according to the embodiment.
Figure 6:
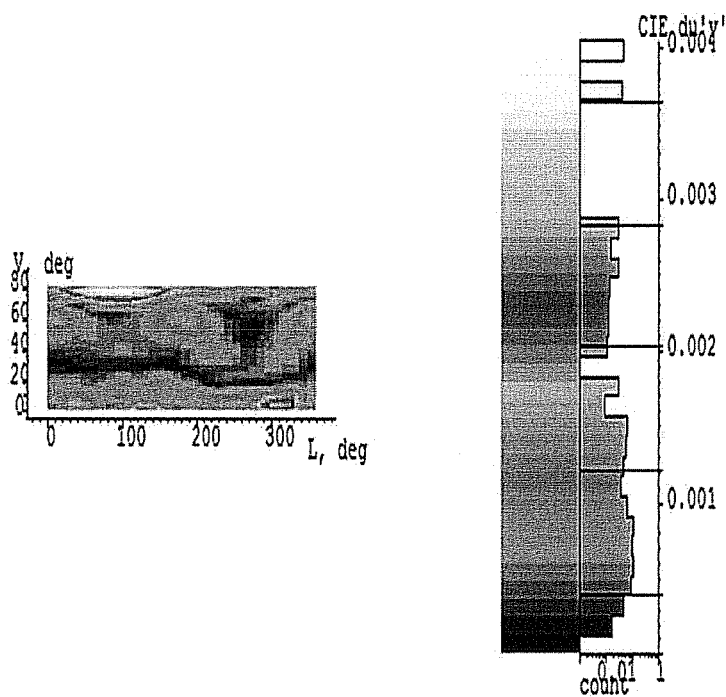
FIG. 6 is a view showing a color coordinate of the illuminating device according to the embodiment.

FIG. 3 is a graph showing a result obtained by simulating color difference values of the illuminating device according to the embodiment. FIG. 4 is a graph showing a spectral distribution and CRI of the illuminating device according to the embodiment. FIG. 5 is a simulation graph showing a luminous intensity distribution of the illuminating device according to the embodiment. FIG. 6 is a view showing a color coordinate of the illuminating device according to the embodiment.

First, FIG. 3 shows the maximum and minimum result of dividing the change rates "g" of the sags of the first and the second lenses 30 and 50 by the slope rate "h" when the color difference is less than 0.006.

According to the simulation result, when the result "i" of dividing the change rates "g" of the sags of the first and the second lenses 30 and 50 by the slope rate "h" has a range from −0.2 to 0.1 mm, it is satisfied that the color difference is less than 0.006.

Also, as shown in the graph of FIG. 4, the illuminating device the embodiment has the highest color rendering index (CRI) within a wavelength of from 600 to 650 mm. As shown in FIG. 5, the illuminating device the embodiment has a beam angle greater than 160°.

As shown in the color coordinate of FIG. 6, the illuminating device according to the embodiment has the maximum illuminance of 0.00405, the minimum illuminance of 1.354e-05, an optical efficiency of 78.006%, a CRI of 89.23 and a correlated color temperature (CCT) of 3706.6. There is no dark portion in the central portion of the color coordinate.

Therefore, it can be seen through the simulation result that the color spatial uniformity and the high color rendering index (CRI) are obtained through the lens design of the 2 in 1 chip package to which the blue chip yellow phosphor and the red chip have been applied.

As described above, in the illuminating device according to the embodiment and a method for designing the illuminating device, the color difference based on the intensity of the light is adjusted to be less than 0.006 by using the 2 in 1 chip package to which the blue chip yellow phosphor and the red chip have been applied. Therefore, the high color rendering index (CRI) is obtained, so that the aforementioned problems can be overcome.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to affect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An illuminating device comprising:
    a substrate;
    a first light emitting chip that is disposed on the substrate;
    a second light emitting chip that is spaced apart from the first light emitting chip and is disposed on the substrate;
    a first lens that includes a first cylindrical side having a height greater than a thickness of the first light emitting chip and includes a first spherical or hemispherical curved surface formed on the first cylindrical side, and that surrounds the first light emitting chip; and
    a second lens that includes a second cylindrical side having a height greater than a thickness of the second light emitting chip and includes a second spherical or hemispherical curved surface formed on the second cylindrical side, and that surrounds the second light emitting chip,
    wherein at least a portion of the first cylindrical side contacts at least a portion of the second cylindrical side, and
    wherein the height of the first cylindrical side is different from the height of the second cylindrical side.

2. The illuminating device of claim 1, wherein the height of the first curved surface is different from the height of the second curved surface.

3. The illuminating device of claim 1, wherein the thickness of the first light emitting chip is different from the thickness of the second light emitting chip.

4. The illuminating device of claim 1, wherein the first light emitting chip is a blue chip and wherein the second light emitting chip is a red chip.

5. The illuminating device of claim 1, wherein the first light emitting chip or the second light emitting chip is comprised of a blue chip and a single or multiple yellow fluorescent materials and a green fluorescent materials.

6. The illuminating device of claim 1, wherein the first light emitting chip or the second light emitting chip is comprised of an ultraviolet light emitting chip and at least one of blue, green and red fluorescent materials or is comprised of the ultraviolet light emitting chip and a compound of at least two of the fluorescent materials.

7. The illuminating device of claim 1, wherein the first lens and the second lens are formed of any one of epoxy resin, silicon resin, urethane resin or a compound of them.

8. The illuminating device of claim 1, wherein the first lens and the second lens are an aspherical lens.

9. The illuminating device of claim 1, wherein the first lens and the second lens further includes a reflective layer disposed on a bottom surface of the first lens and a bottom surface of the second lens.

10. The illuminating device of claim 9, wherein the reflective layer includes a metallic material.

11. An illuminating device comprising:
    a substrate;
    a first light emitting chip that is disposed on the substrate;
    a second light emitting chip that is spaced apart from the first light emitting chip and is disposed on the substrate;
    a first lens that includes a first cylindrical side having a height greater than a thickness of the first light emitting chip and includes a first spherical or hemispherical curved surface formed on the first cylindrical side, and that surrounds the first light emitting chip; and
    a second lens that includes a second cylindrical side having a height greater than a thickness of the second light emitting chip and includes a second spherical or hemispherical curved surface formed on the second cylindrical side, and that surrounds the second light emitting chip,
    wherein a change rate of a sag (a degree of slope) of the second lens is represented by "f", a change rate of the sag of the first lens is represented by "c", change rates of the sags of the first and the second lenses are represented by "g", a slope between the centers of the first and the second lenses is represented by "LS", a slope between the centers of the first and the second light emitting chips is represented by "CS" and a slope rate is represented by "h", it is defined that g=f/c, h=LS/CS and g/h=a result "i", and
    wherein the first and the second light emitting chips and the first and the second lenses are designed such that the result "i" is determined to satisfy a predetermined color difference based on the intensity of light,
    wherein the height of the first cylindrical side is different than the height of the second cylindrical side.

12. The illuminating device of claim 11, wherein the predetermined color difference is less than 0.006.

13. The illuminating device of claim 11, wherein the result "i" has one value within a range of from −0.2 to 0.1 mm.

14. The illuminating device of claim 11, wherein a change rate "c" of the sag of the first lens is represented by (a−b)/(s1/2) and wherein a change rate "f" of the sag of the second lens is represented by (d−e)/(s2/2), wherein "a" is a height of a lens resin on the central portion of the first light emitting chip, "b" is a height of a lens resin on the edge of the first light emitting chip, "s1" is a size of the first light emitting chip, "d" is a height of a lens resin on the central portion of the second light emitting chip, "e" is a height of a lens resin on the edge of the second light emitting chip, and "s2" is a size of the second light emitting chip).

15. The illuminating device of claim 11, wherein the first light emitting chip is a blue chip and wherein the second light emitting chip is a red chip.

16. The illuminating device of claim 11, wherein the first light emitting chip or the second light emitting chip is comprised of a chip and a single or multiple yellow fluorescent materials and a green fluorescent materials.

17. The illuminating device of claim 11, wherein the first light emitting chip or the second light emitting chip is comprised of an ultraviolet light emitting chip and at least one of blue, green and red fluorescent materials or is comprised of the ultraviolet light emitting chip and a compound of at least two of the fluorescent materials.

18. The illuminating device of claim 11, wherein the first lens and the second lens are formed of any one of epoxy resin, silicon resin, urethane resin or a compound of them.

19. The illuminating device of claim 11, wherein the first lens and the second lens are an aspherical lens.

20. The illuminating device of claim 11, wherein the first lens and the second lens further includes a reflective layer disposed on a bottom surface of the first lens and a bottom surface of the second lens.

* * * * *